United States Patent
Yang et al.

(10) Patent No.: US 11,569,403 B2
(45) Date of Patent: Jan. 31, 2023

(54) RESONANT CAVITY ENHANCED (RCE) INTERBAND CASCADE (IC) PHOTOVOLTAIC (PV) DEVICE

(71) Applicant: The Board of Regents of the University of Oklahoma, Norman, OK (US)

(72) Inventors: Rui Q. Yang, Norman, OK (US); Wenxiang Huang, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 64 days.

(21) Appl. No.: 17/344,613

(22) Filed: Jun. 10, 2021

(65) Prior Publication Data

US 2021/0391485 A1 Dec. 16, 2021

Related U.S. Application Data

(60) Provisional application No. 63/038,374, filed on Jun. 12, 2020.

(51) Int. Cl.
| | |
|---|---|
| *H01L 31/054* | (2014.01) |
| *G02B 5/08* | (2006.01) |
| *H02S 10/30* | (2014.01) |
| *H01L 31/0735* | (2012.01) |

(52) U.S. Cl.
CPC ........ *H01L 31/0547* (2014.12); *G02B 5/0816* (2013.01); *H01L 31/0735* (2013.01); *H02S 10/30* (2014.12)

(58) Field of Classification Search
CPC ..... H02S 10/30; G02B 5/0816; H01L 31/054; H01L 31/0547; H01L 31/0735
See application file for complete search history.

(56) References Cited

U.S. PATENT DOCUMENTS

2012/0285531 A1* 11/2012 Forrest .................. H01L 31/055
250/226
2016/0005895 A1* 1/2016 Yang ............... H01L 31/035236
136/255

OTHER PUBLICATIONS

Baldasaro, P. F., et al.; "Thermodynamic Analysis of Thermophotovoltaic Efficiency and Power Density Tradeoffs"; Journal of Applied Physics; vol. 89, No. 6; Mar. 15, 2001; 9 pages.

(Continued)

*Primary Examiner* — Mayla Gonzalez Ramos
(74) *Attorney, Agent, or Firm* — Conley Rose, P. C.; Grant Rodolph; Jonathan K. Polk (57) ABSTRACT

A PV device comprises a first mirror comprising a reflectance of higher than 50%; a second mirror interface; and an optical cavity positioned between the first mirror and the second mirror interface and comprising at least one IC stage. Each of the at least one IC stage comprises a conduction band; a valence band; a hole barrier comprising a first band gap; an absorption region coupled to the hole barrier, comprising a second band gap that is less than the first band gap, and configured to absorb photons; and an electron barrier coupled to the absorption region so that the absorption region is positioned between the hole barrier and the electron barrier. The electron barrier comprises a third band gap that is greater than the second band gap. The PV device is configured to operate at a forward bias voltage with a net photon absorption for generating an electric output.

32 Claims, 6 Drawing Sheets

(56) References Cited

OTHER PUBLICATIONS

Coutts, Timothy J., et al.; "Thermophotovoltaic and Photovoltaic Conversion at High-Flux Densities"; IEEE Transactions on Electron Devices; vol. 46, No. 10; Oct. 1999; 9 pages.

Hinkey, Robert T., et al.; "Theoretical Comparison of Performance Limits of Single- and Multiple-stage Photovoltaic Devices"; Semiconductor Science and Technology; vol. 30; Dec. 5, 2014; 7 pages.

Huang, Wenxiang, et al.; "Enhanced Collection Efficiencies and Performance of Interband Cascade Structures for Narrow Bandgap Semiconductor Thermophotovoltaic Devices"; Journal of Applied Physics; vol. 124; Jul. 9, 2018; 11 pages.

Huang, Wenxiang, et al.; "Limiting Factors and Efficiencies of Narrow Bandgap Single-absorber and Multi-stage Interband Cascade Thermophotovoltaic Cells Under Monochromatic Light Illumination"; Journal of Applied Physics; vol. 126; Jul. 31, 2019; 12 pages.

Nguyen, Binh-Minh, et al.; "Dark Current Suppression in Type II InAs/GaSb Superlattice Long Wavelength Infrared Photodiodes with M-structure Barrier"; Applied Physics Letters; vol. 91, Oct. 18, 2007; 3 pages.

Unlu, M. Selim, et al.; "Resonant Cavity Enhanced Photonic Devices"; Journal of Applied Physics; vol. 78; Jun. 1, 1998; 34 pages.

Yang, Rui Q., et al.; "Interband Cascade Photovoltaic Devices"; Applied Physics Letters; vol. 96; Feb. 9, 2010; 3 pages.

\* cited by examiner

RESONANT CAVITY ENHANCED (RCE) INTERBAND CASCADE (IC) PHOTOVOLTAIC (PV) DEVICE

CROSS-REFERENCE TO RELATED APPLICATIONS

This claims priority to U.S. Prov. Patent App. No. 63/038,374 filed on Jun. 12, 2020, which is incorporated by reference.

STATEMENT REGARDING FEDERALLY SPONSORED RESEARCH OR DEVELOPMENT

This invention was made with government support under Grant Number DMR-1608224 awarded by the National Science Foundation. The government has certain rights in the invention.

BACKGROUND

In analogy to conventional PV cells for solar absorption, TPV cells generate electricity from versatile types of heat sources arising from concentrated sunlight, radio isotopes, combustion processes, and waste heat. One of the main differences between TPV and solar PV is the temperature of the heat source. In potential TPV applications, the heat source typically has a temperature in the range of 1,000-2,000 K, which is much lower than the surface temperature (~5,800 K) of the sun. For a source temperature in this range, theoretical calculations based on the detailed balance theory show that the optimal bandgap $E_g$ of TPV cells is between 0.2 and 0.4 eV. PV cells based on a multistage IC structure with type-II InAs/GaSb SL absorbers can cover this narrow bandgap region for TPV applications.

BRIEF DESCRIPTION OF THE DRAWINGS

Several embodiments of the present disclosure are hereby illustrated in the appended drawings. It is to be noted however, that the appended drawings only illustrate several typical embodiments and are therefore not intended to be considered limiting the scope of the inventive concepts disclosed herein. The figures are not necessarily to scale and certain features and certain views of the figures may be shown as exaggerated in scale or in schematic in the interest of clarity and conciseness.

DETAILED DESCRIPTION

Figure 1:
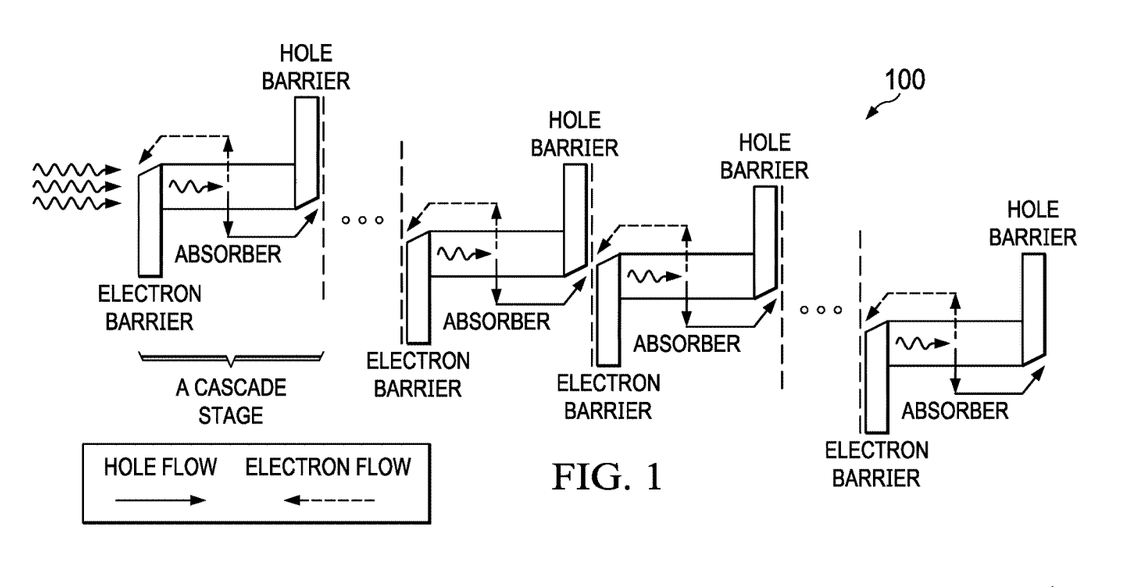
FIG. 1 is a schematic illustration of a multistage ICPV cell under forward voltage. The grey (blue) arrows indicate the ideal transport path of electrons (holes).

ICPV cells also have some advantages over the conventional p-n junction approach. As shown in FIG. 1, in each stage of a multistage ICPV cell 100, the semiconductor absorber is sandwiched between an eB and a hB. The semiconductor absorber can be made of a GaInAsSb bulk layer or an InAs/GaSb SL with a bandgap $E_g$ that is smaller than the bandgap of eB and hB. The eB and hB are made of multiple GaSb/AlSb and InAs/AlSb QWs, respectively, which are unipolar barrier that block the namesake carriers but allow the smooth transport of the other carrier type. The unipolar barriers enable current rectification without resorting to p-n junctions that may otherwise cause significant Shockley-Read-Hall current. An ICPV device comprises multiple discrete absorbers, in which individual absorber thicknesses are shorter than the carrier diffusion length. Consequently, photo-generated carriers are collected with nearly 100% efficiency. On the other hand, the sum of all absorber thicknesses can be much longer than the diffusion length so that nearly all the incident photons are absorbed. Hence, when the ICPV structure is illuminated, the photovoltages from each individual stage add together, creating a high overall open-circuit voltage, similar to multi-junction tandem solar cells, while the photocurrent is reduced with shortened individual absorbers. In addition, in contrast to the Esaki tunnel junction used in multi-junction solar cells, the carrier transport between adjacent stages is facilitated by the broken-gap alignment between InAs and GaSb with negligible internal series resistance.

Preliminary efforts in experiments and theory have demonstrated that the multistage IC structure is able to overcome some outstanding issues that are due to the short diffusion length and small absorption coefficient in conventional single-absorber, narrow-bandgap PV cells: R. Q. Yang, et al., "Interband cascade photovoltaic devices," Appl. Phys. Lett. 96, 063504 (2010); W. Huang, et al., "Enhanced collection efficiencies and performance of interband cascade structures for narrow bandgap semiconductor thermophotovoltaic devices," J. Appl. Phys. 124, 023101 (2018); R. T. Hinkey, R. Q. Yang, "Theoretical comparison of performance of limits of single- and multiple-stage photovoltaic devices," Semicond. Sci. Technol. 30, 015013 (2015); and W. Huang, R. Q. Yang, "Limiting factor and efficiencies of narrow bandgap single-absorber and multi-stage interband cascade thermophotovoltaic cells under monochromatic light illumination," J. Appl. Phys. 126, 045714 (2019). However, as with single-absorber PV cells, the performance of multistage ICPV cells is still severely limited by the significantly high dark saturation current density $J_0$ associated with the narrow bandgap and a short carrier lifetime (Huang, et al. 2019, op. cit). Specifically, the high $J_0$ directly results in a small fill factor and a low voltage efficiency that is defined as $qV_{oc}/N_c E_g$ (where $V_{oc}$ and $N_c$ are open-circuit voltage and number of cascade stages, respectively). It is to overcoming these limitations that the present disclosure is directed.

Novel RCE IC PV cells are disclosed. By combining the IC configuration with an optical cavity, the conversion efficiency of a narrow bandgap PV cell can be significantly enhanced. An optical cavity can be formed with one or two DBR mirrors with a high reflectance (e.g., >50%). A DBR mirror is a periodic stack of two materials with different refractive indices $n_1$ and $n_2$ (FIG. 2), where their thicknesses ($d_1$ and $d_2$) satisfy $n_1d_1=n_2d_2=\lambda/4$, and $\lambda$ is the chosen wavelength of the incident light.

Figure 2:
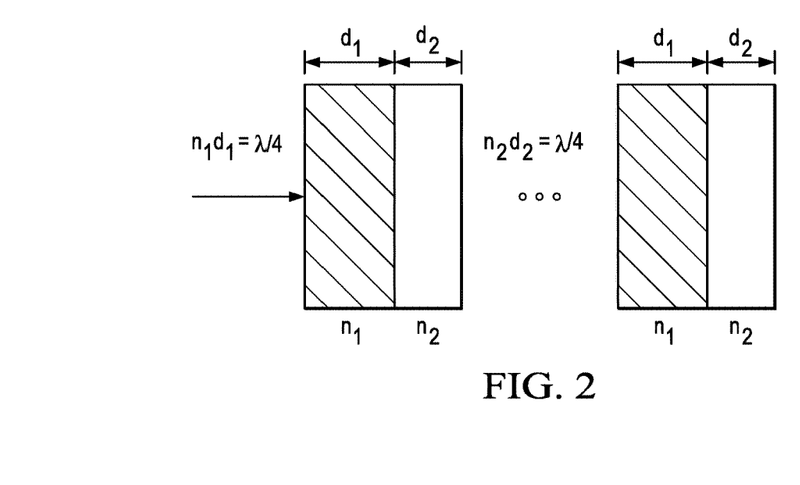
FIG. 2 schematically shows a DBR mirror made of a periodical stack of two materials with different refractive indices $n_1$ and $n_2$, where their thicknesses ($d_1$ and $d_2$) satisfy $n_1 d_1 = n_2 d_2 = \lambda/4$, and $\lambda$ is the chosen wavelength of the incident light.

As shown in FIG. 2, a DBR mirror 200 comprises multiple pairs of two materials, and the reflectance of the DBR mirror increases with more pairs. For example, a DBR mirror with 11 pairs of GaSb/AlSbAs quarter-wave layers lattice matched to GaSb substrate may have a reflectance exceeding 90% at a chosen Bragg wavelength of 4 µm. As noted above, the performance of multistage ICPV cells is severely limited by the significantly high $J_0$ associated with the narrow bandgap and a short carrier lifetime. As shown herein, these issues can be mitigated by placing the active structure as shown in FIG. 1 inside a resonant microcavity with a DBR mirror as shown in FIG. 2, thereby substantially increasing the photocurrent. The enhanced optical field inside the cavity allows the QE to be appreciably improved at the resonant wavelength. Also, the wavelength selectivity provided by the cavity is consistent with the spectral control in a TPV system.

The following abbreviations apply:
Å: angstrom(s)
$cm^{-1}$: inverse centimeter(s)
DBR: distributed Bragg reflector
eB: electron barrier
eV: electronvolt(s)
hB: hole barrier
HRXRD: high-resolution x-ray diffraction
IC: interband cascade
ICPV: interband cascade photovoltaic
J-V: current density-voltage
K: kelvin
MBE: molecular beam epitaxy
meV: millielectronvolt(s)
nm: nanometer(s)
ns: nanosecond(s)
PV: photovoltaic
QE: quantum efficiency
QW: quantum well
RCE: resonant cavity enhanced
SL: superlattice
SWS: standing wave effect
TPV: thermophotovoltaic
V: volt(s)
$W/cm^2$: watts per square centimeter
µm: micrometer(s).

Before further describing various embodiments of the apparatus, component parts, and methods of the present disclosure in more detail by way of exemplary description, examples, and results, it is to be understood that the embodiments of the present disclosure are not limited in application to the details of apparatus, component parts, and methods as set forth in the following description. The embodiments of the apparatus, component parts, and methods of the present disclosure are capable of being practiced or carried out in various ways not explicitly described herein. As such, the language used herein is intended to be given the broadest possible scope and meaning; and the embodiments are meant to be exemplary, not exhaustive. Also, it is to be understood that the phraseology and terminology employed herein is for the purpose of description and should not be regarded as limiting unless otherwise indicated as so. Moreover, in the following detailed description, numerous specific details are set forth in order to provide a more thorough understanding of the disclosure. However, it will be apparent to a person having ordinary skill in the art that the embodiments of the present disclosure may be practiced without these specific details. In other instances, features which are well known to persons of ordinary skill in the art have not been described in detail to avoid unnecessary complication of the description. While the apparatus, component parts, and methods of the present disclosure have been described in terms of particular embodiments, it will be apparent to those of skill in the art that variations may be applied to the apparatus, component parts, and/or methods and in the steps or in the sequence of steps of the method described herein without departing from the concept, spirit, and scope of the inventive concepts as described herein. All such similar substitutes and modifications apparent to those having ordinary skill in the art are deemed to be within the spirit and scope of the inventive concepts as disclosed herein.

All patents, published patent applications, and non-patent publications referenced or mentioned in any portion of the present specification are indicative of the level of skill of those skilled in the art to which the present disclosure pertains, and are hereby expressly incorporated by reference in their entirety to the same extent as if the contents of each individual patent or publication was specifically and individually incorporated herein.

Unless otherwise defined herein, scientific and technical terms used in connection with the present disclosure shall have the meanings that are commonly understood by those having ordinary skill in the art. Further, unless otherwise required by context, singular terms shall include pluralities and plural terms shall include the singular.

As utilized in accordance with the methods and compositions of the present disclosure, the following terms and phrases, unless otherwise indicated, shall be understood to have the following meanings: The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or when the alternatives are mutually exclusive, although the disclosure supports a definition that refers to only alternatives and "and/or." The use of the term "at least one" will be understood to include one as well as any quantity more than one, including but not limited to, 2, 3, 4, 5, 6, 7, 8, 9, 10, 15, 20, 30, 40, 50, 100, or any integer inclusive therein. The phrase "at least one" may extend up to 100 or 1000 or more, depending on the term to which it is attached; in addition, the quantities of 100/1000 are not to be considered limiting, as higher limits may also produce satisfactory results. In addition, the use of the term "at least one of X, Y and Z" will be understood to include X alone, Y alone, and Z alone, as well as any combination of X, Y and Z.

As used in this specification and claims, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain")

are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

Throughout this application, the terms "about" or "approximately" are used to indicate that a value includes the inherent variation of error for the apparatus, composition, or the methods or the variation that exists among the objects, or study subjects. As used herein the qualifiers "about" or "approximately" are intended to include not only the exact value, amount, degree, orientation, or other qualified characteristic or value, but are intended to include some slight variations due to measuring error, manufacturing tolerances, stress exerted on various parts or components, observer error, wear and tear, and combinations thereof, for example. The terms "about" or "approximately", where used herein when referring to a measurable value such as an amount, percentage, temporal duration, and the like, is meant to encompass, for example, variations of ±20% or ±10%, or ±5%, or ±1%, or ±0.1% from the specified value, as such variations are appropriate to perform the disclosed methods and as understood by persons having ordinary skill in the art. As used herein, the term "substantially" means that the subsequently described event or circumstance completely occurs or that the subsequently described event or circumstance occurs to a great extent or degree. For example, the term "substantially" means that the subsequently described event or circumstance occurs at least 90% of the time, or at least 95% of the time, or at least 98% of the time.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, all numerical values or ranges include fractions of the values and integers within such ranges and fractions of the integers within such ranges unless the context clearly indicates otherwise. Thus, to illustrate, reference to a numerical range, such as 1-10 includes 1, 2, 3, 4, 5, 6, 7, 8, 9, 10, as well as 1.1, 1.2, 1.3, 1.4, 1.5, etc., and so forth. Reference to a range of 1-50 therefore includes 1, 2, 3, 4, 5, 6, 7, 8, 9, 10, 11, 12, 13, 14, 15, 16, 17, 18, 19, 20, etc., up to and including 50, as well as 1.1, 1.2, 1.3, 1.4, 1.5, etc., 2.1, 2.2, 2.3, 2.4, 2.5, etc., and so forth. Reference to a series of ranges includes ranges which combine the values of the boundaries of different ranges within the series. Thus, to illustrate reference to a series of ranges, for example, a range of 1-1,000 includes, for example, 1-10, 10-20, 20-30, 30-40, 40-50, 50-60, 60-75, 75-100, 100-150, 150-200, 200-250, 250-300, 300-400, 400-500, 500-750, 750-1,000, and includes ranges of 1-20, 10-50, 50-100, 100-500, and 500-1,000. The range 100 units to 2000 units therefore refers to and includes all values or ranges of values of the units, and fractions of the values of the units and integers within said range, including for example, but not limited to 100 units to 1000 units, 100 units to 500 units, 200 units to 1000 units, 300 units to 1500 units, 400 units to 2000 units, 500 units to 2000 units, 500 units to 1000 units, 250 units to 1750 units, 250 units to 1200 units, 750 units to 2000 units, 150 units to 1500 units, 100 units to 1250 units, and 800 units to 1200 units. Any two values within the range of about 100 units to about 2000 units therefore can be used to set the lower and upper boundaries of a range in accordance with the embodiments of the present disclosure. More particularly, a range of 10-12 units includes, for example, 10, 10.1, 10.2, 10.3, 10.4, 10.5, 10.6, 10.7, 10.8, 10.9, 11.0, 11.1, 11.2, 11.3, 11.4, 11.5, 11.6, 11.7, 11.8, 11.9, and 12.0, and all values or ranges of values of the units, and fractions of the values of the units and integers within said range, and ranges which combine the values of the boundaries of different ranges within the series, e.g., 10.1 to 11.5.

The present disclosure will now be discussed in terms of several specific, non-limiting, examples and embodiments. The examples described below, which include particular embodiments, will serve to illustrate the practice of the present disclosure, it being understood that the particulars shown are by way of example and for purposes of illustrative discussion of particular embodiments and are presented in the cause of providing what is believed to be a useful and readily understood description of procedures as well as of the principles and conceptual aspects of the present disclosure.

Growth of DBR Mirror Stack

To form an optical cavity on a semiconductor substrate, a bottom DBR mirror with a high reflectance is typically required. In one non-limiting embodiment, the RCE ICPV device is grown on a GaSb substrate. The bottom DBR mirror is a GaSb/AlAsSb quarter-wave stack lattice-matched to GaSb. The refractive index at a target wavelength 4.0 µm for GaSb and AlAsSb is close to 3.78 and 3.18, respectively, which provides a sufficient contrast for achieving a high reflectance (e.g., 90%) without many pairs (<12). The initial DBR mirror has 10 pairs in the GaSb/AlAsSb quarter-wave stack.

MBE growth of the DBR can be somewhat challenging because it requires stable fluxes and precise control of the growth rates to achieve accurate layer thicknesses and the lattice-matched alloy composition. A small deviation in the thickness can result in a noticeable shift of the reflectance peak from the designed location. For the DBR sample (M388) that was initially grown, the average period of the GaSb/AlAsSb mirror is 545.6 nm according to the HRXRD profile. This thickness was about 5.7% thinner than the designed 578.7 nm for each period.

Figure 3:
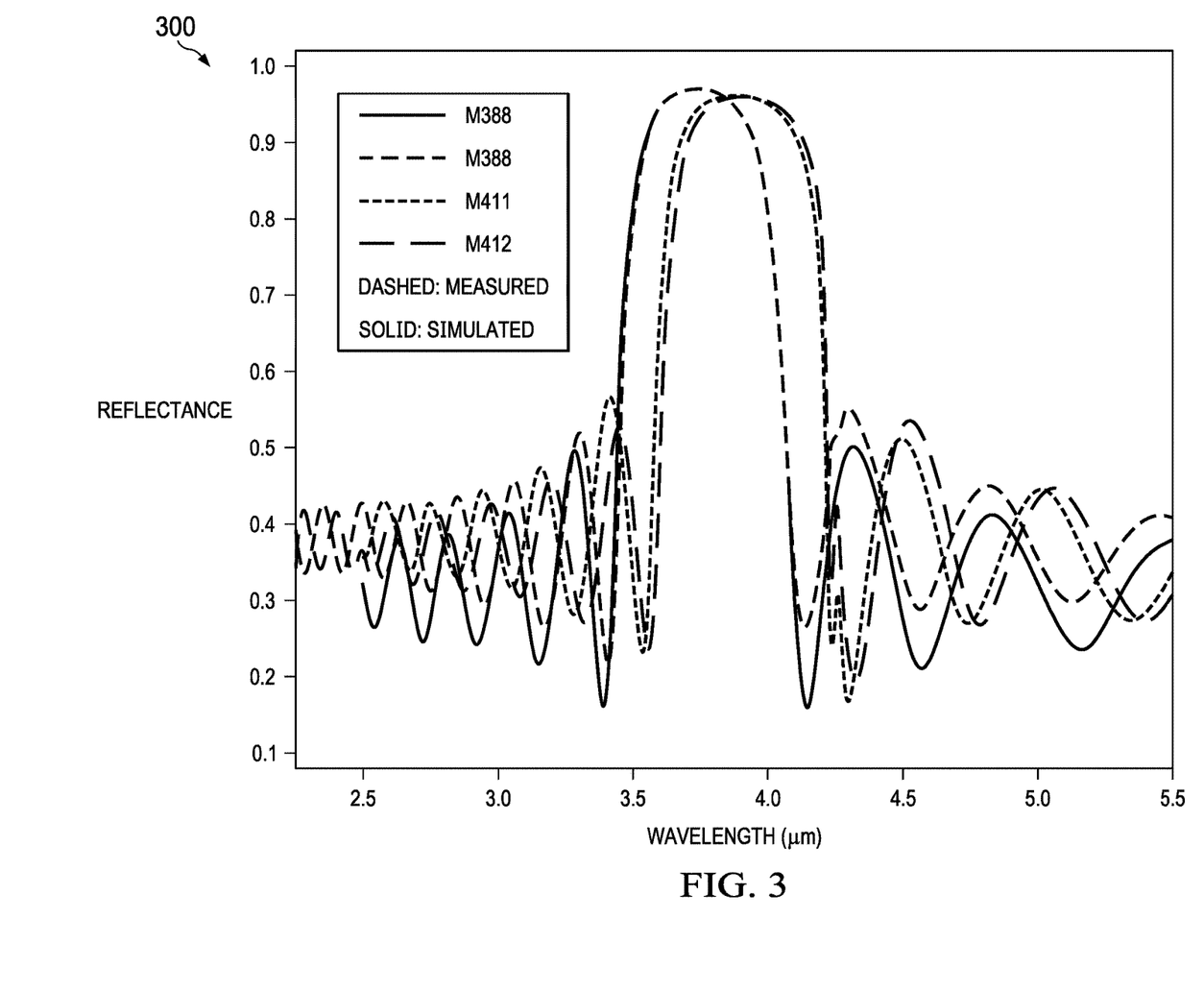
FIG. 3 shows measured (solid) and simulated (dashed) reflectance spectra for three GaSb/AlAsSb DBR mirrors with ten periods.

FIG. 3 is a graph 300 showing the observed reflectance spectrum (solid curve) for the DBR structure in FIG. 2, as measured at an incident angle of 30°. The position of peak reflectance (~0.97) is about 3.74 µm, rather than at the designed wavelength of 4 µm. FIG. 3 also displays the simulated reflectance calculated assuming 5.72% deviations of layer thickness for both GaSb and AlAsSb. The refractive index used in the simulation is 3.78 and 3.18 for GaSb and AlAsSb, respectively. As can be seen, the simulation closely matches the experiment, which indirectly validates the values of refractive index used in the simulation.

The variation in the layer thickness of a grown DBR mirror should be within 5% to make the target wavelength fall in the stopband of the DBR. Two additional DBR wafers (M411 and M412) were grown later by intentionally adjusting the shutter open times in order to tune the peak reflectance to be close to 4 μm, as intended by the design. The resulting layer thicknesses were slightly increased, as revealed by the measured reflectance spectra of the two DBRs (see FIG. 3). The peak reflection occurs at 3.89 (M411) and 3.91 (M412) μm with deviations less than 3% from the targeted 4 μm. An even better agreement between an actual growth and the design can be achieved with further effort and incorporation of the PV cavity structure. Desirably, the resonant wavelength in the PV cavity matches with the Bragg wavelength of the DBR so that discrete individual absorbers are centered at the antinodes of a standing wave at the designed wavelength. Antinodes are locations where the amplitude of a standing wave in a cavity reaches a maximum.

Regular ICPV Devices

In one embodiment, a regular ICPV structure was grown on an undoped p-type GaSb (001) substrate to examine the suitability of the InAs/GaSb SL absorbers for placement in an optical cavity created with a DBR mirror. The bandgap of the SL absorber should be somewhat smaller than the incident photon energy. This ensures adequate absorption of incident photons without generating much thermalization loss. The designed bandgap of the SL absorber is 270 meV, about 40 meV smaller than the incident photon energy, corresponding to a cutoff wavelength of 4.6 μm at 300 K. The grown ICPV structure has fifteen cascade stages, in which each period of the SL absorber consists of four layers: InAs (27.4 Å), GaSb (15 Å), AlInSb (7.6 Å), and GaSb (15 Å). The AlInSb layer was inserted to form the so-called M-shaped SL. All the layers of the SL absorber were p-type doped, making electrons the minority carriers. The sequence of individual absorber thicknesses (in Å) is: 96/136.5/143/ 149.5/156/162.5/169/175.5/182/195/201.5/214.5/227.5/ 240.5/253.5, from top to bottom. The absorber thickness was increased in the optically deeper stages in order to achieve current matching. The eB was composed of four digitally graded GaSb/AlSb QWs, while the hole barrier was made of eight digitally graded InAs/AlSb QWs. This regular ICPV structure was used to examine the bandgap of the InAs/GaSb SL. Based on characterization of devices made from this regular ICPV structure (as shown in FIG. 1) and previously studied ICPV wafers, the number of stages, absorber thicknesses, and compositions will be adjusted for the expected RCE ICPV device.

Figure 4:
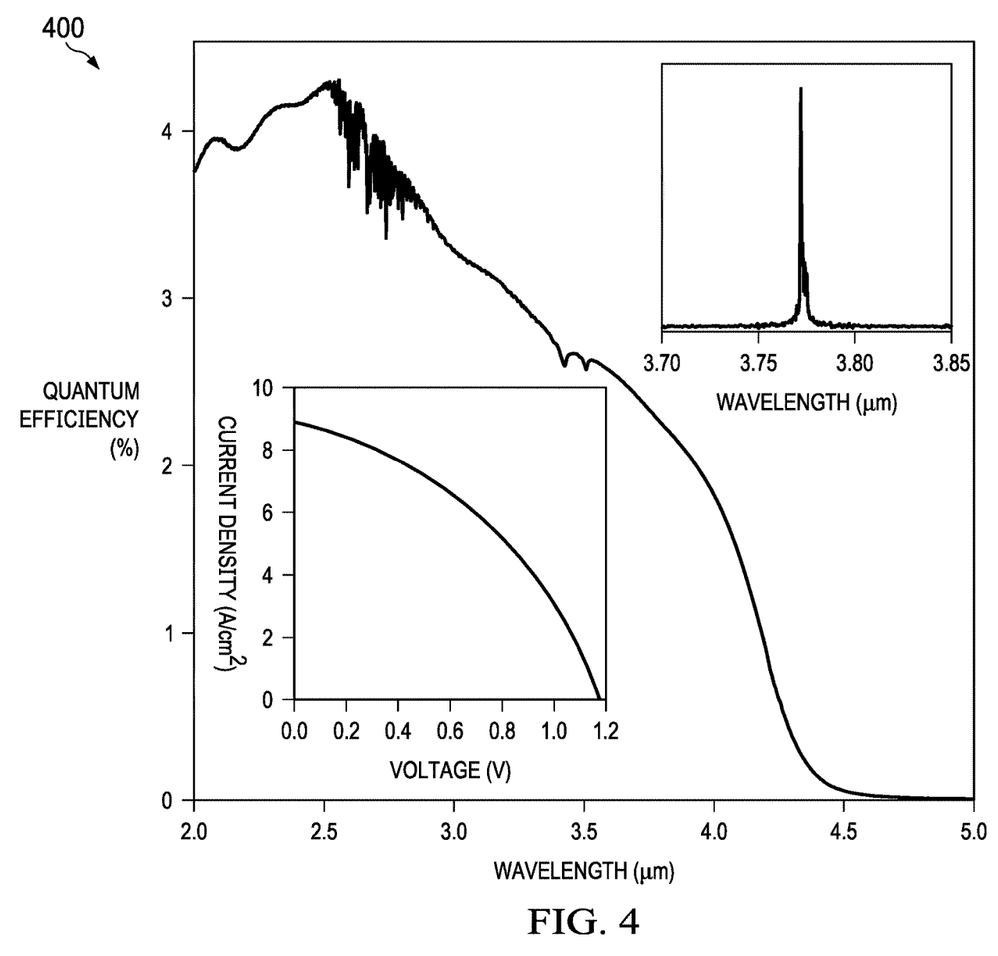
FIG. 4 shows a quantum efficiency spectrum for a regular fifteen-stage ICPV device at 300 K. The insets display the illuminated current J-V characteristics (bottom left) and the emission spectrum of the IC laser that was used as the illumination source (top right).

FIG. 4 is a graph 400 showing the zero-bias QE spectrum of the regular fifteen-stage ICPV device in FIG. 1 at 300 K. As can be seen, the 100% cutoff wavelength at 300 K was 4.4 μm, corresponding to a bandgap of 282 meV, which was slightly higher than the designed value (~270 meV). The observed bandgap widening agrees with the information provided by an HRXRD measurement. The average thickness in each period of the SL was 64.5 Å, which was 0.72% thinner than designed (65 Å). This implies good control over layer thickness during MBE growth. The relatively low QE is due to the small amount of light absorption in each stage with thin individual absorbers. The PV performance of the regular fifteen-stage ICPV device was studied using a type-II IC laser. During the measurement, the laser was cooled to ~80 K and continuously emitted at 3.77 μm (329 meV) with the spectrum presented in the top-right inset to FIG. 4. The photon energy in the laser beam is about 47 meV higher than the bandgap, resulting in a thermal relaxation loss of approximately 17%. The illuminated J-V curve under the highest illumination level (with an incident power density of 98 W/cm$^2$) available from the IC laser is shown in the bottom-left inset to FIG. 4. As shown, the open-circuit voltage was 1.14 V, which greatly exceeds the single bandgap value and therefore indicates an effective cascade effect. The achievable conversion efficiency at the highest illumination level was about 3.2%, which was primarily limited by the high dark current density with a narrow bandgap as mentioned above.

Resonant Cavity Enhanced ICPV Device

Figure 5:
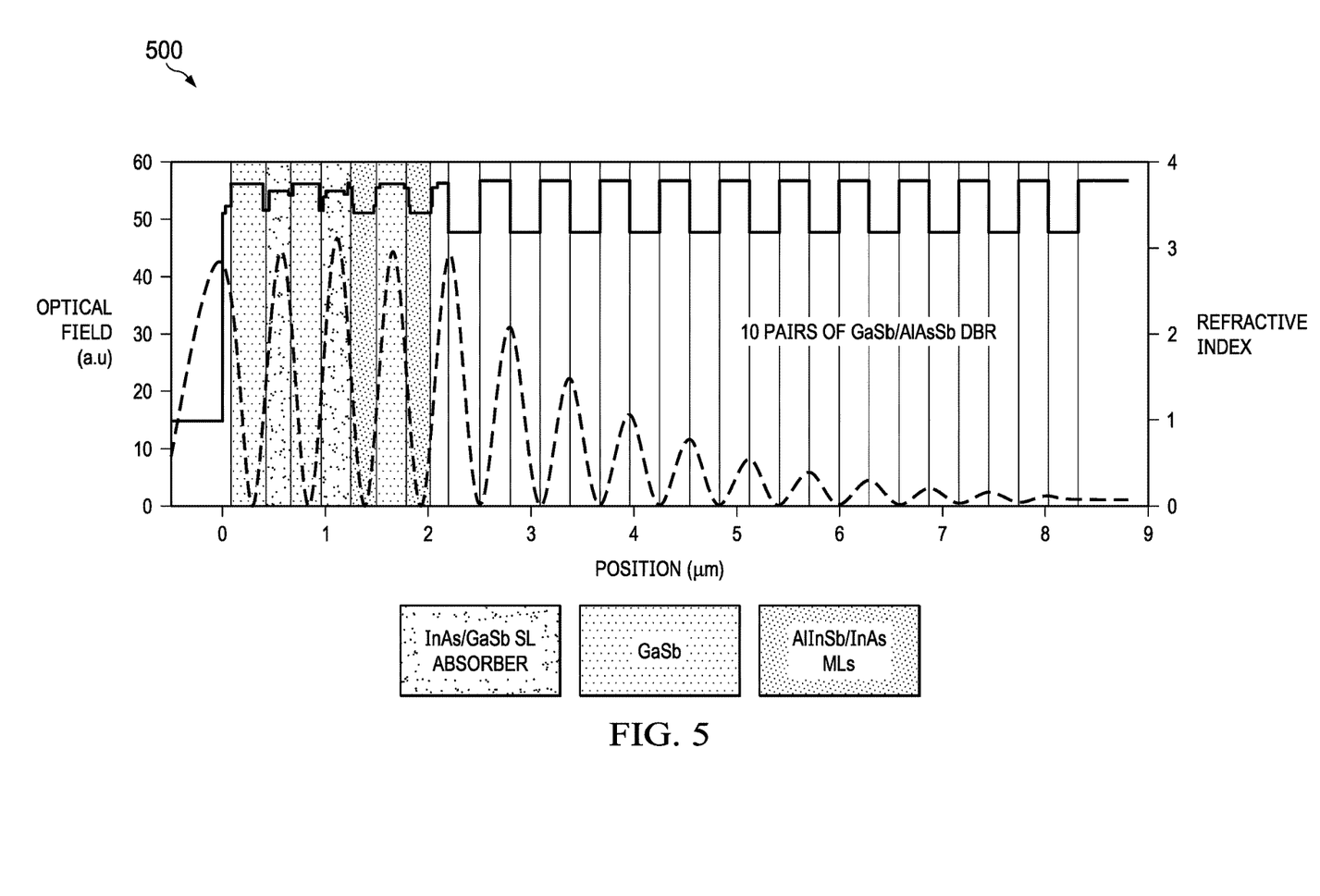
FIG. 5 shows a refractive index profile and a simulated optical field distribution in the designed RCE ICPV cell with two cascade stages. The wavelength of incident light is 4 μm.

As demonstrated herein, the relatively low efficiency of a regular ICPV device can be greatly improved when combined with a bottom DBR mirror with high reflectance. In a simplified design, the top mirror can be due to the large refractive index difference at the interface between the semiconductor and air. This provides a reflectance $R_1$ of approximately 30%, which can be used to form a cavity with a bottom DBR mirror in one embodiment of an RCE ICPV device. Inside the cavity, each of the InAs/GaSb SL absorbers is placed at an antinode of a resonant mode for enhancing the absorption and matching photocurrent between stages. It is not easy to meet this requirement since some variations of the layer thicknesses or their refractive indices can result in substantial shifts of the antinode positions, particularly when the absorber thickness is rather thin and many stages are embedded. Therefore, to alleviate these difficulties, in one non-limiting embodiment, the RCE ICPV may have only two cascade stages with a discrete absorber thickness of 192 nm, which is relatively thicker than the absorbers of typical conventional RCE photodetectors reported elsewhere. FIG. 5 is a graph 500 showing a simulated optical field distribution, along with the refractive index profile, in the designed RCE ICPV device. The reflectance of the bottom DBR $R_2$ is estimated to be 90%.

The simulation and refractive index profile explicitly illustrate how this embodiment of the RCE ICPV device is constructed. Inside the cavity, three cavity antinodes are formed, around two of which the two discrete InAs/GaSb SL absorbers are located, spanning nearly 20% of the period of the standing wave at a wavelength of 4 μm. The calculated SWE, or rather the enhancement of QE, is about 1.7 based on Eq. (12) in M. S. Ünlü and S. Strite, "Resonant cavity enhanced photonic devices," J. Appl. Phys. 78, 607 (1995), which is as follows:

$$SWE = \frac{\int_L^{L+d} |E|^2 dz/d}{2\int_0^{\lambda/2} |E|^2 dz/\lambda}, \quad (1)$$

where L is the location coordinate of the initial boundary of the individual absorber, d is the thickness of an individual absorber, E is the electrical field component inside the cavity, and λ is the wavelength. The boosted QE due to the cavity and SWE is estimated to be 44% with an absorption coefficient of 3,000 cm$^{-1}$. The third cavity antinode is not arranged with an absorber, but filled with GaSb, for providing extra tolerance space for wet etching. The etching is started from the top surface downward and ends in a layer past the second SL absorber and before the bottom DBR. Considering the relatively low accuracy of controlling the chemical etching depth in the designed RCE ICPV device, layers that are about 800 nm thick are inserted between the second SL absorber and the bottom DBR. These layers provide etching tolerance and serve as a bottom contact to metal on the side. Besides GaSb, these are mainly AlInSb/ InAs multiple layers as shown in FIG. 5.

Figure 6:
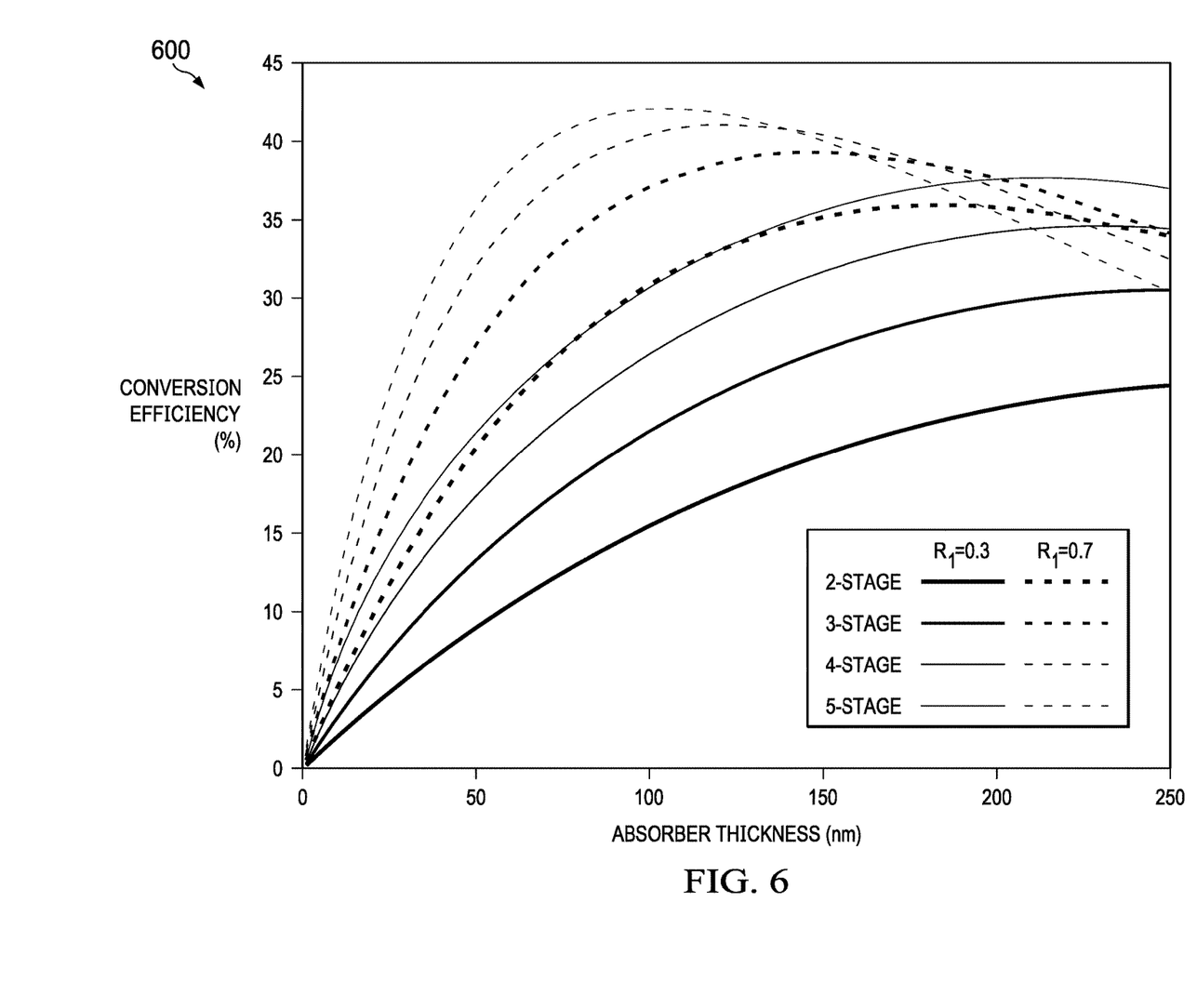
FIG. 6 shows calculated conversion efficiency as a function of the individual absorber thickness of the prospective RCE ICPV cells with various cascade stages and two different values of the top mirror reflectance $R_1$.

Following the diffusion limited model described in detail in Hinkley, et al., 2015, and Huang, et al., 2019, op. cit., the calculated conversion efficiency of the designed RCE ICPV cells is about 23%, significantly higher than what regular ICPV devices can achieve with the same parameters and conditions (carrier lifetime~20 ns and incident power density of 50 W/cm$^2$). The projected high efficiency shows the great potential of this approach in further optimizing the performance of narrow bandgap PV cells. The high value of efficiency can be enhanced by adding more stages and increasing the absorber thickness, as shown in a graph 600 in FIG. 6. The efficiency can be raised even further by increasing the reflectance $R_1$ of the top mirror (e.g., by using the DBR stack in FIG. 2) as shown in a graph 700 in FIG. 7. This relies on the precise placement of the absorbers on each cavity antinode. As can be seen in FIG. 6, an efficiency as high as 42% is possible for a five-stage RCE ICPV cell with 100 nm individual absorbers and an $R_1$ of 70%. The conversion efficiency increases with the number of stages when the absorbers are thin (<130 nm) as shown in FIG. 6 and placed at cavity antinodes. This is a unique advantage of RCE ICPV cells, which are able to make full use of the multiple antinodes in a resonant cavity.

Figure 7:
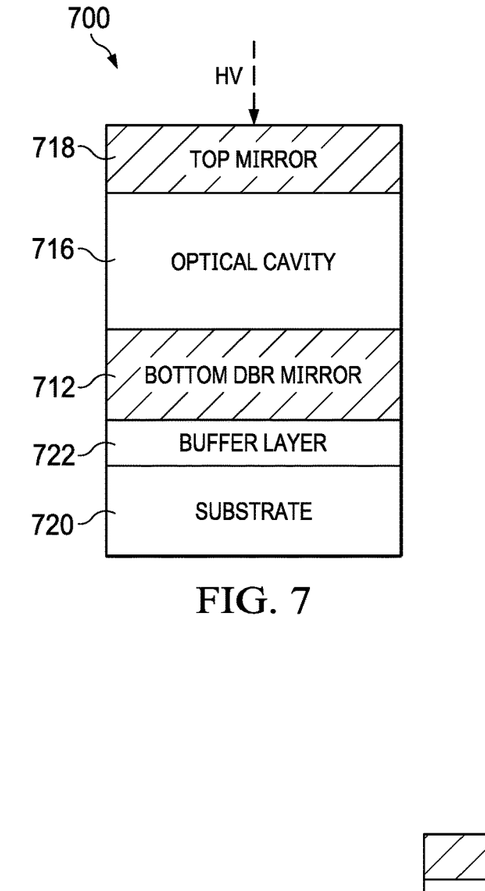
FIG. 7 shows a schematic layer structure with two mirrors and with light illumination from the top. The photon energy hv is chosen to match the resonant mode in the optical cavity.

RCE IC PV devices can be grown on GaSb substrates or InAs substrates. An optical cavity can be formed with one or two DBR mirrors (one on the bottom and the other on the top as shown in FIG. 7). Both the bottom mirror and top mirror can be made in other ways. For example, the cavity is formed with one bottom DBR mirror and one metal layer on the top with light illumination hv from the bottom side of the substrate as shown by a RCE ICPV structure 800 in FIG. 8, where the substrate can be thinned down and anti-reflection coated.

Figure 8:
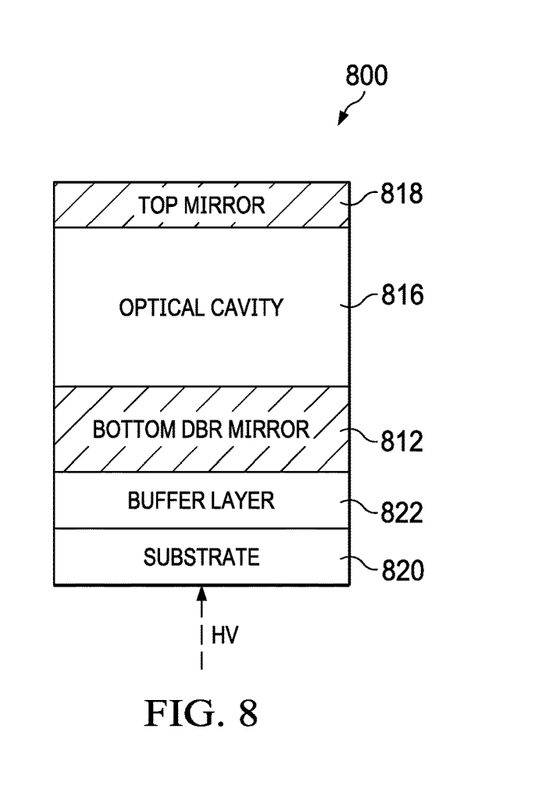
FIG. 8 shows a schematic layer structure with the bottom DBR mirror and the top metal mirror, while light illumination is from the bottom substrate. The photon energy hv is chosen to match the resonant mode in the optical cavity.

The RCE ICPV cell 700 comprises a top mirror 718, an optical cavity 716, a bottom DBR mirror 712, a buffer layer 722, and a substrate 720. The RCE ICPV structure 800 comprises a top mirror 818, an optical cavity 816, a bottom DBR mirror 812, a buffer layer 822, and a substrate 820.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, apparatus and methods described and illustrated in the various embodiments as discrete or separate may be combined or integrated with other systems, components, techniques, or methods without departing from the scope of the present disclosure. Other items shown or discussed as coupled may be directly coupled or may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A photovoltaic (PV) device comprising:
   a first mirror comprising a reflectance of higher than 50%;
   a second mirror interface; and
   an optical cavity positioned between the first mirror and the second mirror interface and comprising at least one interband cascade (IC) stage, wherein each of the at least one IC stage comprises:
   a conduction band;
   a valence band;
   a hole barrier comprising a first band gap;
   an absorption region coupled to the hole barrier, comprising a second band gap that is less than the first band gap, and configured to absorb photons; and
   an electron barrier coupled to the absorption region so that the absorption region is positioned between the hole barrier and the electron barrier, wherein the electron barrier comprises a third band gap that is greater than the second band gap,
   wherein the PV device is configured to operate at a forward bias voltage with a net photon absorption for generating an electric output.

2. The photovoltaic device of claim 1, wherein the at least one IC stage comprises a plurality of IC stages.

3. The photovoltaic device of claim 2, wherein the optical cavity further comprises absorbers located at centers of antinodes.

4. The photovoltaic device of claim 1, wherein the first mirror is a distributed Bragg reflector (DBR) quarter-wave stack at a Bragg wavelength matched to a resonant mode of the optical cavity.

5. The photovoltaic device of claim 4, wherein the DBR quarter-wave stack comprises a plurality of layers, and wherein the layers comprise a first layer with a highest refractive index, and wherein the first layer is closest among the layers to the optical cavity.

6. The photovoltaic device of claim 4, wherein the second mirror interface is configured to interface between a top semiconductor layer of the optical cavity and air.

7. The photovoltaic device of claim 4, further comprising a metal layer on a top of the second mirror interface, wherein the photovoltaic device is configured to illuminate an incident light from the first mirror to the optical cavity.

8. The photovoltaic device of claim 1, further comprising a DBR quarter-wave stack on a top of the second mirror interface, wherein the DBR quarter-wave stack comprises a Bragg wavelength that is matched to a resonant mode of the optical cavity.

9. The photovoltaic device of claim 8, wherein the DBR quarter-wave stack comprises a plurality of layers, and wherein the layers comprise a first layer with a highest refractive index, and wherein the first layer is closest among the layers to the optical cavity.

10. The photovoltaic device of claim 1, wherein the photovoltaic device is a thermophotovoltaic device.

11. The photovoltaic device of claim 1, wherein the absorption region comprises type-II quantum wells or a type-II superlattice.

12. The photovoltaic device of claim 1, wherein the absorption region comprises a semiconductor layer selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

13. The photovoltaic device of claim 1, wherein the hole barrier comprises a semiconductor layer selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

14. The photovoltaic device of claim 1, wherein the electron barrier comprises a semiconductor layer selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

15. The photovoltaic device of claim 1, further comprising a substrate selected from the group consisting of InAs, InP, GaAs, GaSb, and Si.

16. The photovoltaic device of claim 1, wherein the at least one IC stage comprises a first IC stage and a second IC stage, and wherein the electron barrier region of the first IC stage is coupled via a type-II heterointerface with the hole barrier of the second IC stage.

17. A photovoltaic (PV) device comprising:
a first mirror comprising a reflectance of higher than 50%;
a second mirror interface; and
an optical cavity positioned between the first mirror and the second mirror interface and comprising at least one interband cascade (IC) stage, wherein each of the at least one IC stage comprises:
a conduction band;
a valence band;
a hole barrier comprising a first band gap;
an absorption region coupled to the hole barrier, comprising a second band gap that is less than the first band gap, and configured to absorb photons; and
an electron barrier coupled to the absorption region so that the absorption region is positioned between the hole barrier and the electron barrier, wherein the electron barrier comprises a third band gap that is greater than the second band gap.

18. The photovoltaic device of claim 17, wherein the at least one IC stage comprises a plurality of IC stages.

19. The photovoltaic device of claim 18, wherein the optical cavity further comprises absorbers located at centers of antinodes.

20. The photovoltaic device of claim 17, wherein the first mirror is a distributed Bragg reflector (DBR) quarter-wave stack at a Bragg wavelength matched to a resonant mode of the optical cavity.

21. The photovoltaic device of claim 20, wherein the DBR quarter-wave stack comprises a plurality of layers, and wherein the layers comprise a first layer with a highest refractive index, and wherein the first layer is closest among the layers to the optical cavity.

22. The photovoltaic device of claim 20, wherein the second mirror interface is configured to interface between a top semiconductor layer of the optical cavity and air.

23. The photovoltaic device of claim 20, further comprising a metal layer on a top of the second mirror interface, wherein the photovoltaic device is configured to illuminate an incident light from the first mirror to the optical cavity.

24. The photovoltaic device of claim 17, further comprising a DBR quarter-wave stack on a top of the second mirror interface, wherein the DBR quarter-wave stack comprises a Bragg wavelength that is matched to a resonant mode of the optical cavity.

25. The photovoltaic device of claim 24, wherein the DBR quarter-wave stack comprises a plurality of layers, and wherein the layers comprise a first layer with a highest refractive index, and wherein the first layer is closest among the layers to the optical cavity.

26. The photovoltaic device of claim 17, wherein the photovoltaic device is a photodetector device.

27. The photovoltaic device of claim 17, wherein the absorption region comprises type-II quantum wells or a type-II superlattice.

28. The photovoltaic device of claim 17, wherein the absorption region comprises a semiconductor layer selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

29. The photovoltaic device of claim 17, wherein the hole barrier comprises a semiconductor layer selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

30. The photovoltaic device of claim 17, wherein the electron barrier comprises a semiconductor layer selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

31. The photovoltaic device of claim 17, further comprising a substrate selected from the group consisting of InAs, InP, GaAs, GaSb, and Si.

32. The photovoltaic device of claim 17, wherein the at least one IC stage comprises a first IC stage and a second IC stage, and wherein the electron barrier region of the first IC stage is coupled via a type-II heterointerface with the hole barrier of the second IC stage.

* * * * *